United States Patent
Wang et al.

(10) Patent No.: US 11,238,769 B2
(45) Date of Patent: Feb. 1, 2022

(54) SHIFT REGISTER UNIT, DRIVING METHOD, GATE DRIVING CIRCUIT AND DISPLAY DEVICE

(71) Applicants: HEFEI BOE OPTOELECTRONICS TECHNOLOGY CO., LTD., Anhui (CN); BOE TECHNOLOGY GROUP CO., LTD., Beijing (CN)

(72) Inventors: Ying Wang, Beijing (CN); Hongmin Li, Beijing (CN); Dong Wang, Beijing (CN); Fengjing Tang, Beijing (CN)

(73) Assignees: HEFEI BOE OPTOELECTRONICS TECHNOLOGY CO., LTD., Anhui (CN); BOE TECHNOLOGY GROUP CO., LTD., Beijing (CN)

(*) Notice: Subject to any disclaimer, the term of this patent is extended or adjusted under 35 U.S.C. 154(b) by 391 days.

(21) Appl. No.: 16/479,484

(22) PCT Filed: Jan. 3, 2019

(86) PCT No.: PCT/CN2019/070179
§ 371 (c)(1),
(2) Date: Jul. 19, 2019

(87) PCT Pub. No.: WO2019/223331
PCT Pub. Date: Nov. 28, 2019

(65) Prior Publication Data
US 2021/0350734 A1    Nov. 11, 2021

(30) Foreign Application Priority Data

May 25, 2018   (CN) .......................... 201810516807.9

(51) Int. Cl.
*G09G 5/00*   (2006.01)
*G09G 3/20*   (2006.01)
*G11C 19/28*  (2006.01)

(52) U.S. Cl.
CPC ............... *G09G 3/20* (2013.01); *G11C 19/28* (2013.01); *G09G 2300/0426* (2013.01);
(Continued)

(58) Field of Classification Search
CPC ............. G09G 3/20; G09G 2300/0426; G09G 2300/0842; G09G 2310/0267; G09G 2310/0286; G09G 2310/08; G11C 19/28
See application file for complete search history.

(56) References Cited

U.S. PATENT DOCUMENTS

2008/0055293 A1   3/2008   Kuo et al.
2014/0119491 A1   5/2014   Liu
(Continued)

FOREIGN PATENT DOCUMENTS

CN    102930814 A    2/2013
CN    105304057 A    2/2016
(Continued)

OTHER PUBLICATIONS

CN102930814A, English Abstract and U.S. Equivalent U.S. Pub. No. 2014/0119491.
(Continued)

*Primary Examiner* — Adam J Snyder
(74) *Attorney, Agent, or Firm* — Brooks Kushman P.C.

(57) ABSTRACT

The present disclosure provides a shift register unit, including an input sub-circuitry, a pull-up node control sub-circuitry, a pull-down node control sub-circuitry, a gate driving output sub-circuitry and a carry signal output sub-circuitry. The input sub-circuitry is connected to an input end, a second clock signal input end and a pull-up node. The pull-up node control sub-circuitry is connected to the pull-up node, a pull-down node, a first clock signal input end and a first voltage input end. The pull-down node control sub-circuitry is connected to the pull-down node, the pull-up
(Continued)

node, the first clock signal input end, the first voltage input end and a second voltage input end.

20 Claims, 3 Drawing Sheets

(52) U.S. Cl.
CPC ............... *G09G 2300/0842* (2013.01); *G09G 2310/0267* (2013.01); *G09G 2310/0286* (2013.01); *G09G 2310/08* (2013.01)

(56) References Cited

U.S. PATENT DOCUMENTS

| | | | |
|---|---|---|---|
| 2014/0320466 A1 | 10/2014 | Son | |
| 2016/0180788 A1* | 6/2016 | Xiao | G09G 3/20 345/204 |
| 2017/0193943 A1* | 7/2017 | Cao | G09G 3/20 |
| 2017/0221439 A1 | 8/2017 | Chen et al. | |
| 2017/0256224 A1* | 9/2017 | Xiao | G09G 3/3677 |
| 2017/0301302 A1* | 10/2017 | Zhao | G09G 3/36 |
| 2017/0330633 A1 | 11/2017 | Sun et al. | |
| 2018/0144688 A1* | 5/2018 | Lee | G09G 3/3266 |
| 2018/0174503 A1* | 6/2018 | Shim | G09G 3/3266 |
| 2019/0156732 A1* | 5/2019 | Kong | G09G 3/30 |
| 2020/0090570 A1 | 3/2020 | Feng et al. | |

FOREIGN PATENT DOCUMENTS

| | | |
|---|---|---|
| CN | 105489189 A | 4/2016 |
| CN | 106157867 A | 11/2016 |

OTHER PUBLICATIONS

CN105304057A, English Abstract and U.S. Equivalent U.S. Pub. No. 2017/0330633.
CN105489189A, English Abstract and U.S. Equivalent U.S. Pub. No. 2017/0221439.
CN106157867A, English Abstract and U.S. Equivalent U.S. Pub. No. 2020/0090570.
First Office Action for Chinese Application No. 201810516807.9, dated Jun. 3, 2020, 16 Pages.

* cited by examiner

SHIFT REGISTER UNIT, DRIVING METHOD, GATE DRIVING CIRCUIT AND DISPLAY DEVICE

CROSS-REFERENCE TO RELATED APPLICATION APPLICATIONS

This application is the U.S. national phase of PCT Application No. PCT/CN2019/070179 filed on Jan. 3, 2019, which claims priority to Chinese Patent Application No. 201810516807.9 filed on May 25, 2018, which are incorporated herein by reference in their entireties.

TECHNICAL FIELD

The present disclosure relates to the field of display driving technology, in particular to a shift register unit, a driving method, a gate driving circuit and a display device.

BACKGROUND

Currently, a resolution of a display panel becomes higher and higher, and a gate driving circuit and a source driving circuit of a display device are each provided with a relatively large quantity of output ends. Due to an increase in a length of each driving circuit, more bonding operations need to be performed. In order to solve this problem, a Gate On Array (GOA) technique has been adopted by more and more manufacturers. Through the GOA technique, it is unnecessary to perform any Gate Chip On Flex (or Chip On Film, COF for short) bonding operation, and meanwhile it is able to provide the display panel with a narrow bezel. However, a conventional GOA circuit is relatively complex (it includes a large quantity of clock signals and a large quantity of transistors), and there is an obvious noise. In addition, for a conventional gate driving circuit, an input signal is directly applied by a shift register unit to a next-level shift register unit via its gate driving signal output end. Insufficient driving capability is caused when the gate driving signal output end needs to apply the input signal to the next-level shift register unit, and thereby the output stability of a gate driving signal is adversely affected.

SUMMARY

In one aspect, the present disclosure provides in some embodiments a shift register unit, including an input sub-circuitry, a pull-up node control sub-circuitry, a pull-down node control sub-circuitry, a gate driving output sub-circuitry, and a carry signal output sub-circuitry. The input sub-circuitry is coupled to an input end, a second clock signal input end and a pull-up node, and configured to write an input signal from the input end into the pull-up node at an input stage under the control of the second clock signal input end. The pull-up node control sub-circuitry is coupled to the pull-up node, a pull-down node, a first clock signal input end and a first voltage input end, and configured to write a first voltage into the pull-up node at a restoration stage under the control of the first clock signal input end and the pull-down node. The first voltage input end is configured to input the first voltage. The pull-down node control sub-circuitry is coupled to the pull-down node, the pull-up node, the first clock signal input end, the first voltage input end and a second voltage input end, and configured to write the first voltage into the pull-down node at the input stage and an output stage under the control of the pull-up node, and write a second voltage into the pull-down node at the restoration stage under the control of the first clock signal input end. The second voltage input end is configured to input the second voltage. The gate driving output sub-circuitry is coupled to the pull-up node, the pull-down node, a gate driving signal output end, a third clock signal input end and a third voltage input end, and configured to output a third clock signal via the gate driving signal output end at the input stage and the output stage under the control of the pull-up node, and output a third voltage via the gate driving signal output end at the restoration stage under the control of the pull-down node. The third clock signal input end is configured to input the third clock signal, and the third voltage input end is configured to input the third voltage. The carry signal output sub-circuitry is coupled to the pull-up node, the pull-down node, a carry signal output end, the third clock signal input end and the third voltage input end, and configured to control a potential at the pull-up node, output the third clock signal via the carry signal output end at the input stage and the output stage under the control of the pull-up node, and output the third voltage via the carry signal output end at the restoration stage under the control of the pull-down node.

In some possible embodiments of the present disclosure, the pull-down node control sub-circuitry is further configured to write the second voltage into the pull-down node at a resetting stage prior to the input stage under the control of the first clock signal input end.

In some possible embodiments of the present disclosure, the pull-down node control sub-circuitry includes: a first pull-down node control transistor, a gate electrode of which is coupled to the pull-up node, a first electrode of which is coupled to the pull-down node, and a second electrode of which is coupled to the first voltage input end; and a second pull-down node control transistor, a gate electrode of which is coupled to the first clock signal input end, a first electrode of which is coupled to the second voltage input end, and a second electrode of which is coupled to the pull-down node.

In some possible embodiments of the present disclosure, the pull-down node control sub-circuitry is further configured to write the first clock signal into the pull-down node at the input stage and the output stage under the control of the pull-up node. The first clock signal input end is configured to input a first clock signal.

In some possible embodiments of the present disclosure, the pull-down node control sub-circuitry further includes a third pull-down node control transistor, a gate electrode of which is coupled to the pull-up node, a first electrode of which is coupled to the pull-down node, and a second electrode of which is coupled to the first clock signal input end.

In some possible embodiments of the present disclosure, the pull-up node control sub-circuitry is further configured to write the first voltage into the pull-up node at the restoration stage under the control of the first clock signal input end and the pull-down node.

In some possible embodiments of the present disclosure, the pull-up node control sub-circuitry includes: a first pull-up node control transistor, a gate electrode of which is coupled to the first clock signal input end, and a first electrode of which is coupled to the pull-up node; and a second pull-up node control transistor, a gate electrode of which is coupled to the pull-down node, a first electrode of which is coupled to a second electrode of the first pull-up node control transistor, and a second electrode of which is coupled to the first voltage input end.

In some possible embodiments of the present disclosure, the gate driving output sub-circuitry includes: a first gate driving output transistor, a gate electrode of which is coupled to the pull-up node, a first electrode of which is coupled to the third clock signal input end, and a second electrode of which is coupled to the gate driving signal output end; and a second gate driving output transistor, a gate electrode of which is coupled to the pull-down node, a first electrode of which is coupled to the gate driving signal output end, and a second electrode of which is coupled to the third voltage input end. The carry signal output sub-circuitry includes: a first carry signal output transistor, a gate electrode of which is coupled to the pull-up node, a first electrode of which is coupled to the third clock signal, and a second electrode of which is coupled to the carry signal output end; a second carry signal output transistor, a gate electrode of which is coupled to the pull-down node, a first electrode of which is coupled to the carry signal output end, and a second electrode of which is coupled to the third voltage input end; and a storage capacitor, a first end of which is coupled to the pull-up node, and a second end of which is coupled to the carry signal output end.

In some possible embodiments of the present disclosure, the second gate driving output transistor and the second carry signal output transistor are both N-type transistors, and the first voltage inputted by the first voltage input end is substantially smaller than the third voltage inputted by the third voltage input end; or the second gate driving output transistor and the second carry signal output transistor are both P-type transistors, and the first voltage inputted by the first voltage input end is substantially greater than the third voltage inputted by the third voltage input end.

In some possible embodiments of the present disclosure, the input sub-circuitry includes an input transistor, a gate electrode of which is coupled to the second clock signal input end, a first electrode of which is coupled to the pull-up node, and a second electrode of which is coupled to the input end.

In some possible embodiments of the present disclosure, the first voltage is a first low voltage VGL1, the second voltage is a high voltage VGH, and the third voltage is a second low voltage VGL2.

In some possible embodiments of the present disclosure, the second end of the storage capacitor is merely coupled to the carry signal output end or the gate driving signal output end, or coupled to both the gate driving signal output end and the carry signal output end.

In another aspect, the present disclosure provides in some embodiments a method for driving the above-mentioned shift register unit. Each display period includes an input stage, an output stage and a restoration stage arranged one after another. The method includes: at the input stage, applying an input signal to the input end, and writing, by the input sub-circuitry, the input signal into the pull-up node under the control of the second clock signal input end, so as to enable a potential at the pull-up node to be an active level; at the output stage, controlling, by the carry signal output sub-circuitry, the potential at the pull-up node to be still the active level; at the input stage and the output stage, writing, by the pull-down node control sub-circuitry, a first voltage into the pull-down node under the control of the pull-up node, outputting, by the gate driving output sub-circuitry, a third clock signal via the gate driving signal output end under the control of the pull-up node, and outputting, by the carry signal output sub-circuitry, the third clock signal via the carry signal output end under the control of the pull-up node; and at the restoration stage, writing, by the pull-up node control sub-circuitry, the first voltage into the pull-up node under the control of the first clock signal input end and the pull-down node, stopping, by the gate driving output sub-circuitry, outputting the third clock signal via the gate driving signal output end under the control of the pull-up node, stopping, by the carry signal output sub-circuitry, outputting the third clock signal via the carry signal output end under the control of the pull-up node, stopping, by the pull-down node control sub-circuitry, writing the first voltage into the pull-down node under the control of the pull-up node, writing, by the pull-down node control sub-circuitry, a second voltage into the pull-down node under the control of the first clock signal input end, outputting, by the gate driving output sub-circuitry, a third voltage via the gate driving signal output end under the control of the pull-down node, and outputting, by the carry signal output sub-circuitry, the third voltage via the carry signal output end under the control of the pull-down node.

In some possible embodiments of the present disclosure, the method further includes: at the input stage and the output stage, writing, by the pull-down node control sub-circuitry, the first clock signal into the pull-down node under the control of the pull-up node; and at the restoration stage, stopping, by the pull-down node control sub-circuitry, writing the first clock signal into the pull-down node under the control of the pull-up node.

In some possible embodiments of the present disclosure, each display period further includes a resetting stage prior to the input stage, and the method further includes, at the resetting stage, writing, by the pull-down node control sub-circuitry, a second voltage into the pull-down node under the control of the first clock signal input end, and writing, by the pull-up node control sub-circuitry, the first voltage into the pull-up node under the control of the first clock signal input end and the pull-down node.

In some possible embodiments of the present disclosure, the gate driving output sub-circuitry includes a first gate driving output transistor and a second gate driving output transistor, and the carry signal output sub-circuitry includes a first carry signal output transistor, a second carry signal output transistor and a storage capacitor. The second gate driving output transistor and the second carry signal output transistor are both N-type transistors, the first voltage inputted by the first voltage input end is substantially smaller than the third voltage inputted by the third voltage input end so that the second gate driving output transistor and the second carry signal output transistor are each in an off state at the output stage; or the second gate driving output transistor and the second carry signal output transistor are both P-type transistors, the first voltage inputted by the first voltage input end is substantially greater than the third voltage inputted by the third voltage input end so that the second gate driving output transistor and the second carry signal output transistor are each in the off state at the output stage.

In yet another aspect, the present disclosure provides in some embodiments a gate driving circuit, including a plurality of the above-mentioned shift register units coupled to each other in a cascaded manner. Apart from a last-level shift register unit, a carry signal output end of a current-level shift register unit is coupled to an input end of a next-level shift register unit.

In still yet another aspect, the present disclosure provides in some embodiments a display device including the above-mentioned gate driving circuit.

BRIEF DESCRIPTION OF THE DRAWINGS

In order to illustrate the technical solutions of the present disclosure or the related art in a clearer manner, the drawings desired for the present disclosure or the related art will be described hereinafter briefly. Obviously, the following drawings merely relate to some embodiments of the present disclosure, and based on these drawings, a person skilled in the art may obtain the other drawings without any creative effort.

DETAILED DESCRIPTION

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

All transistors adopted in the embodiments of the present disclosure are TFTs, field effect transistors (FETs) or any other elements having an identical characteristic. In order to differentiate two electrodes other than a gate electrode from each other, one of the two electrodes is called as first electrode and the other is called as second electrode. In actual use, the first electrode is a drain electrode while the second electrode is a source electrode. Alternatively the first electrode is a source electrode while the second electrode is a drain electrode.

Figure 1:
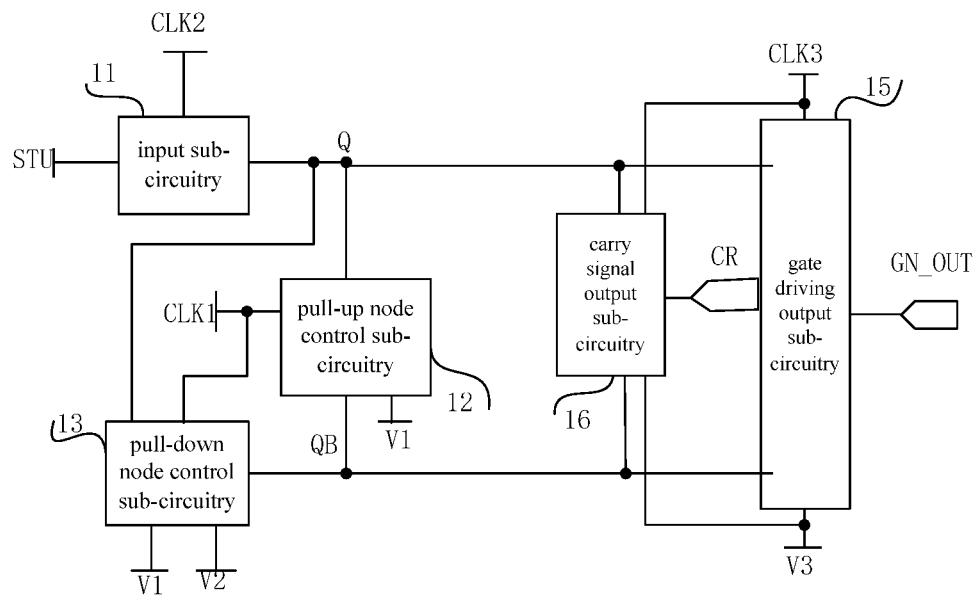
FIG. 1 is a schematic view showing a shift register unit according to some embodiments of the present disclosure.

As shown in FIG. 1, the present disclosure provides in some embodiments a shift register unit which includes an input end STU, a gate driving signal output end GN_OUT, a carry signal output end CR, a first clock signal input end CLK1, a second clock signal input end CLK2, a third clock signal input end CLK3, an input sub-circuitry 11, a pull-up node control sub-circuitry 12, a pull-down node control sub-circuitry 13, a gate driving output sub-circuitry 15 and a carry signal output sub-circuitry 16.

The input sub-circuitry 11 is coupled to the input end STU, the second clock signal input end CLK2 and a pull-up node Q respectively, and configured to write an input signal from the input end STU into the pull-up node PU at an input stage under the control of the second clock signal input end CLK2.

The pull-up node control sub-circuitry 12 is coupled to the pull-up node Q, a pull-down node QB, the first clock signal input end CLK1 and a first voltage input end respectively, and configured to write a first voltage V1 into the pull-up node Q at a restoration stage under the control of the first clock signal input end CLK1 and the pull-down node QB. The first voltage input end is configured to input the first voltage V1.

The pull-down node control sub-circuitry 13 is coupled to the pull-down node QB, the pull-up node Q, the first clock signal input end CLK1, the first voltage input end and a second voltage input end respectively, and configured to write the first voltage V1 into the pull-down node QB at the input stage and an output stage under the control of the pull-up node Q, and write a second voltage V2 into the pull-down node QB at a restoration stage under the control of the first clock signal input end CLK1. The second voltage input end is configured to input the second voltage V2.

The gate driving output sub-circuitry 15 is coupled to the pull-up node Q, the pull-down node QB, a gate driving signal output end GN_OUT, the third clock signal input end CLK3 and a third voltage input end respectively, and configured to output a third clock signal via the gate driving signal output end GN_OUT at the input stage and the output stage under the control of the pull-up node Q, and output a third voltage V3 via the gate driving signal output end GN_OUT at the restoration stage under the control of the pull-down node QB. The third clock signal input end CLK3 is configured to input the third clock signal, and the third voltage input end is configured to input the third voltage V3.

The carry signal output sub-circuitry 16 is coupled to the pull-up node Q, the pull-down node QB, the carry signal output end CR, the third clock signal input end CLK3 and the third voltage input end respectively, and configured to control a potential at the pull-up node Q, output the third clock signal via the carry signal output end CR at the input stage and the output stage under the control of the pull-up node Q, and output the third voltage V3 via the carry signal output end CR at the restoration stage under the control of the pull-down node QB.

According to the shift register unit in the embodiments of the present disclosure, a relatively small quantity of transistors and clock signal lines are adopted, so it is able to simplify the structure of the shift register unit, control a signal sequence conveniently, and provide a narrow bezel. In addition, a carry signal is provided by the carry signal output sub-circuitry, and an input signal is applied to a next-level shift register unit via the carry signal output end, so as to prevent the occurrence of insufficient driving capability caused when the input signal is applied by the gate driving signal output end to the next-level shift register unit, thereby to improve the output stability of a gate driving signal.

During the operation of the shift register unit in FIG. 1, each display period includes a resetting stage, an input stage, an output stage and a restoration stage arranged one after another.

At the resetting stage, the pull-down node control sub-circuitry 13 writes the second voltage V2 into the pull-down node QB under the control of the first clock signal input end CLK1, and the pull-up node control sub-circuitry 12 writes the first voltage V1 into the pull-up node Q under the control of the first clock signal input end CLK1 and the pull-down node QB.

At the input stage, the input signal is applied to the input end STU, the input sub-circuitry 11 writes the input signal into the pull-up node Q under the control of the second clock signal input end CLK2 so as to enable the potential at the pull-up node Q to be an active level (the active level is a level capable of turning on a first gate driving transistor (not shown in FIG. 1) which is included in the gate driving output sub-circuitry 15 and whose gate electrode is coupled to the pull-up node), the pull-down node control sub-circuitry 13 writes the first voltage V1 into the pull-down node QB under the control of the pull-up node Q, the gate driving output sub-circuitry 15 outputs the third clock signal via the gate driving signal output end GN_OUT under the control of the pull-up node Q, and the carry signal output sub-circuitry 16 outputs the third clock signal via the carry signal output end CR under the control of the pull-up node Q.

At the output stage, the carry signal output sub-circuitry 16 controls the potential at the pull-up node Q to be still the active level, the pull-down node control sub-circuitry 13 writes the first voltage V1 into the pull-down node under the control of the pull-up node QB, the gate driving output sub-circuitry 15 outputs the third clock signal via the gate driving signal output end GN_OUT under the control of the pull-up node Q, and the carry signal output sub-circuitry 16 outputs the third clock signal via the carry signal output end CR under the control of the pull-up node Q.

At the restoration stage, the pull-up node control sub-circuitry 12 writes the first voltage V1 into the pull-up node Q under the control of the first clock signal input end CLK1 and the pull-down node QB, the gate driving output sub-circuitry 15 stops outputting the third clock signal via the gate driving signal output end GN_OUT under the control of the pull-up node Q, the carry signal output sub-circuitry 16 stops outputting the third clock signal via the carry signal output end CR under the control of the pull-up node Q, the pull-down node control sub-circuitry 13 stops writing the first voltage V1 into the pull-down node QB under the control of the pull-up node Q and writes the second voltage V2 into the pull-down node QB instead under the control of the first clock signal input end CLK1, the gate driving output sub-circuitry 15 outputs the third voltage V3 via the gate driving signal output end GN_OUT under the control of the pull-down node QB, and the carry signal output sub-circuitry 16 outputs the third voltage V3 via the carry signal output end CR under the control of the pull-down node QB.

During the implementation, V1 is a first low level, V2 is a high level, and V3 is a second low level. However, the present disclosure shall not be limited thereto.

During the implementation, the resetting stage is provided prior to the input stage. The pull-down node control sub-circuitry is further configured to write the second voltage into the pull-down node at the resetting stage under the control of the first clock signal input end, so as to reset a potential at the pull-down node, and enable the pull-up node control sub-circuitry to write the first voltage into the pull-up node at the resetting stage under the control of the first clock signal input end and the pull-down node (a function of the pull-up node control sub-circuitry at the resetting stage will be described hereinafter), thereby to empty remaining charges on the pull-up node within a previous display period, and improve the output stability of the gate driving signal.

To be specific, the pull-down node control sub-circuitry includes: a first pull-down node control transistor, a gate electrode of which is coupled to the pull-up node, a first electrode of which is coupled to the pull-down node, and a second electrode of which is coupled to the first voltage input end; and a second pull-down node control transistor, a gate electrode of which is coupled to the first clock signal input end, a first electrode of which is coupled to the second voltage input end, and a second electrode of which is coupled to the pull-down node.

In some possible embodiments of the present disclosure, the pull-down node control sub-circuitry is further configured to write the first clock signal into the pull-down node at the input stage and the output stage under the control of the pull-up node. The first clock signal input end is configured to input the first clock signal.

In some possible embodiments of the present disclosure, the pull-down node control sub-circuitry is further configured to write the first clock signal into the pull-down node at the input stage and the output stage, so as to control the potential at the pull-down node to be a first level in a better manner at the input stage and the output stage, and control the potential at the pull-down node to be a second level even when the potential at the pull-up node is not reduced in time at the restoration stage.

In the embodiments of the present disclosure, the first level is, but not limited to, a low level, and the second level is, but not limited to, a high level. When the potential at the pull-down node is the first level, a second gate driving output transistor which is included in the gate driving output sub-circuitry and whose gate electrode is coupled to the pull-down node is turned off, and when the potential at the pull-down node is the second level, the second gate driving signal output transistor is turned on.

In some possible embodiments of the present disclosure, the pull-down node control sub-circuitry further includes a third pull-down node control transistor, a gate electrode of which is coupled to the pull-up node, a first electrode of which is coupled to the pull-down node, and a second electrode of which is coupled to the first clock signal input end.

In some possible embodiments of the present disclosure, the pull-up node control sub-circuitry is further configured to write the first voltage into the pull-up node at the resetting stage under the control of the first clock signal input end and the pull-down node, so as to empty remaining charges on the pull-up node within the previous display period, prevent the output of the gate driving signal within a current display period from being adversely affected by the remaining charges on the pull-up node, and enable the potential at the pull-up node to be the first voltage at the beginning of the input stage, thereby to improve the output stability of the gate driving signal. When the potential at the pull-up node is the first voltage, the first gate driving output transistor which is included in the gate driving output sub-circuitry and whose gate electrode is coupled to the pull-up node is turned off.

During the implementation, the first voltage is, but not limited to, a first low voltage.

To be specific, the pull-up node control sub-circuitry includes: a first pull-up node control transistor, a gate electrode of which is coupled to the first clock signal input end, and a first electrode of which is coupled to the pull-up node; and a second pull-up node control transistor, a gate electrode of which is coupled to the pull-down node, a first electrode of which is coupled to a second electrode of the first pull-up node control transistor, and a second electrode of which is coupled to the first voltage input end.

To be specific, the gate driving output sub-circuitry includes: a first gate driving output transistor, a gate electrode of which is coupled to the pull-up node, a first electrode of which is coupled to the third clock signal input end, and a second electrode of which is coupled to the gate driving signal output end; and a second gate driving output transistor, a gate electrode of which is coupled to the pull-down node, a first electrode of which is coupled to the gate driving signal output end, and a second electrode of which is coupled to the third voltage input end.

The carry signal output sub-circuitry includes: a first carry signal output transistor, a gate electrode of which is coupled to the pull-up node, a first electrode of which is coupled to the third clock signal, and a second electrode of which is coupled to the carry signal output end; a second carry signal output transistor, a gate electrode of which is coupled to the pull-down node, a first electrode of which is coupled to the carry signal output end, and a second electrode of which is coupled to the third voltage input end; and a storage capacitor, a first end of which is coupled to the pull-up node, and a second end of which is coupled to the carry signal output end.

In some possible embodiments of the present disclosure, when the second gate driving output transistor and the second carry signal output transistor are both N-type transistors, the first voltage inputted by the first voltage input end is substantially smaller than the third voltage inputted by the third voltage input end, so as to turn off the second gate driving transistor and the second carry signal output transistor at the output stage, and reduce a leakage current, thereby to reduce a noise of the gate driving signal; or when the second gate driving output transistor and the second carry signal output transistor are both P-type transistors, the first voltage inputted by the first voltage input end is substantially greater than the third voltage inputted by the third voltage input end, so as to turn off the second gate driving transistor and the second carry signal output transistor at the output stage, and reduce a leakage current, thereby to reduce a noise of the gate driving signal.

To be specific, the input sub-circuitry includes an input transistor, a gate electrode of which is coupled to the second clock signal input end, a first electrode of which is coupled to the pull-up node, and a second electrode of which is coupled to the input end.

The shift register unit will be described hereinafter in conjunction with a specific embodiment.

Figure 2:
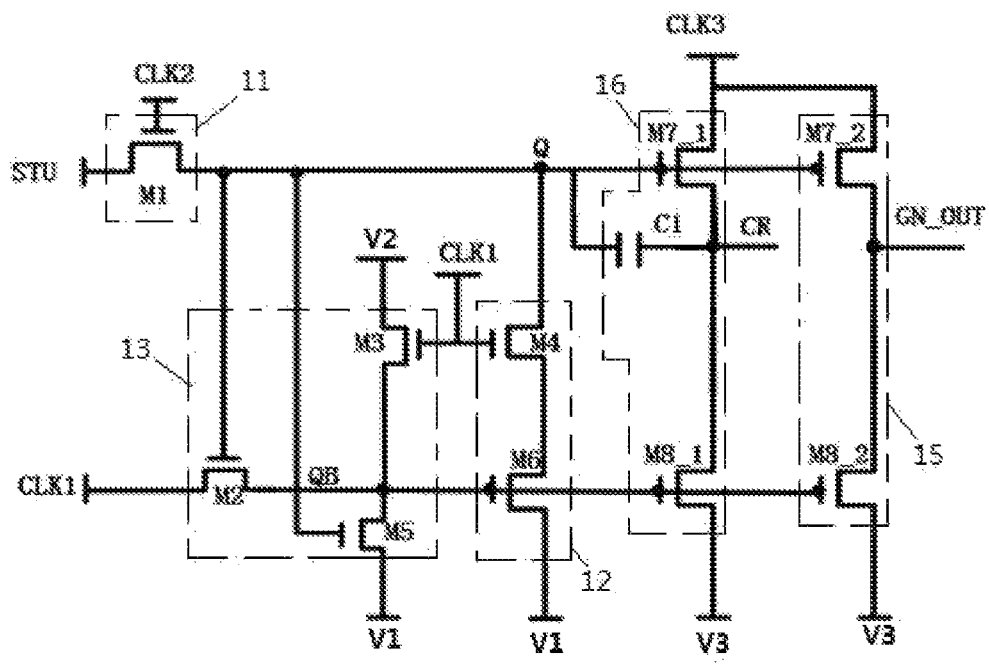
FIG. 2 is a circuit diagram of the shift register unit according to some embodiments of the present disclosure.

As shown in FIG. 2, the shift register unit includes the input end STU, the gate driving signal output end GN_OUT, the carry signal output end CR, the input sub-circuitry 11, the pull-up node control sub-circuitry 12, the pull-down node control sub-circuitry 13, the gate driving output sub-circuitry 15 and the carry signal output sub-circuitry 16.

The input sub-circuitry 11 includes for example an input transistor M1, a gate electrode of which his coupled to the second clock signal input end CLK2, a drain electrode of which is coupled to the pull-up node Q, and a source electrode of which is coupled to the input end STU.

The pull-up node control sub-circuitry 12 includes: a first pull-up node control transistor M4, a gate electrode of which is coupled to the first clock signal input end CLK1, and a drain electrode of which is coupled to the pull-up node Q; and a second pull-up node control transistor M6, a gate electrode of which is coupled to the pull-down node QB, a drain electrode of which is coupled to the source electrode of the first pull-up node control transistor M4, and a source electrode of which is configured to receive the first voltage V1.

The pull-down node control sub-circuitry 13 includes: a first pull-down node control transistor M5, a gate electrode of which is coupled to the pull-up node Q, a drain electrode of which is coupled to the pull-down node QB, and a source electrode of which is configured to receive the first voltage V1; a second pull-down node control transistor M3, a gate electrode of which is coupled to the first clock signal input end CLK1, a drain electrode of which is configured to receive the second voltage V2, and a source electrode of which is coupled to the pull-down node QB; and a third pull-down node control transistor M2, a gate electrode of which is coupled to the pull-up node PU, a drain electrode of which is coupled to the pull-down node QB, and a source electrode of which is coupled to the first clock signal input end CLK1.

The gate driving output sub-circuitry 15 includes: a first gate driving output transistor M7_2, a gate electrode of which is coupled to the pull-up node Q, a drain electrode of which is coupled to the third clock signal input end CLK3, and a source electrode of which is coupled to the gate driving signal output end GN_OUT; and a second gate driving output transistor M8_2, a gate electrode of which is coupled to the pull-down node QB, a drain electrode of which is coupled to the gate driving signal output end GN_OUT, and a source electrode of which is configured to receive the third voltage V3.

The carry signal output sub-circuitry 16 includes: a first carry signal output transistor M7_1, a gate electrode of which is coupled to the pull-up node Q, a drain electrode of which is coupled to the third clock signal input end CLK3, and a source electrode of which is coupled to the carry signal output end CR; a second carry signal output transistor M8_1, a gate electrode of which is coupled to the pull-down node Q, a drain electrode of which is coupled to the carry signal output end CR, and a source electrode of which is configured to receive the third voltage V3; and a storage capacitor C1, a first end of which is coupled to the pull-up node Q, and a second end of which is coupled to the carry signal input end CR.

In the embodiment of the present disclosure as shown in FIG. 2, the first voltage V1 is a first low voltage VGL1, the second voltage V2 is a high voltage VGH, and the third voltage V3 is a second low voltage VGL2.

In the embodiment of the present disclosure as shown in FIG. 2, three clock signals and two low voltages are adopted. The shift register unit includes one capacitor and ten transistors, and two-stage output is adopted, so it is able to improve the output stability of the gate driving signal. The input signal is applied by CR to the next-level shift register unit, and the corresponding gate driving signal is applied by GN_OUT to a corresponding gate line. As a result, the shift register unit in this embodiment has a simple structure, so it is able to effectively reduce the noise of the gate driving signal.

In the embodiment of the present disclosure as shown in FIG. 2, the second end of C1 is merely coupled to CR. However, in actual use, the second end of C1 is also merely coupled to GN_OUT, or to both GN_OUT and CR.

In the embodiment of the present disclosure as shown in FIG. 2, all the transistors are, but not limited to, N-type transistors. In actual use, the transistors are also P-type transistors.

Figure 3:
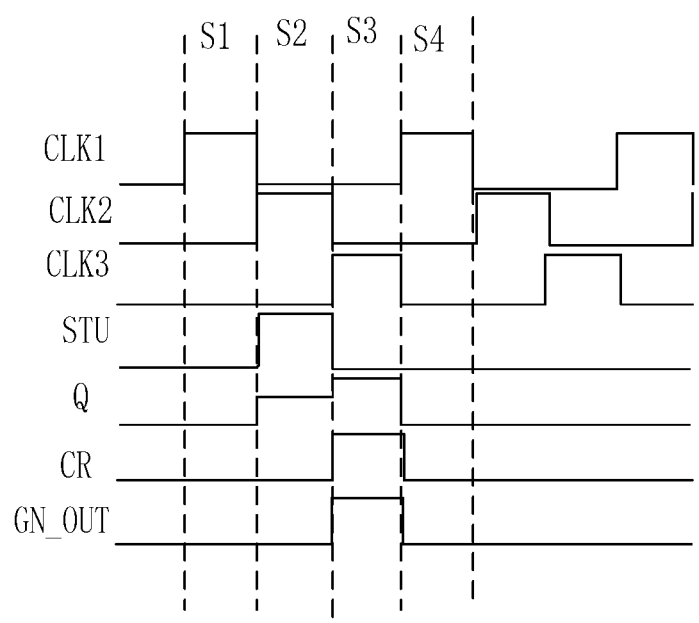
FIG. 3 is a sequence diagram of the shift register unit according to some embodiments of the present disclosure.

During the operation of the shift register unit in FIG. 2, as shown in FIG. 3, each display period includes a resetting stage S1, an input stage S2, an output stage S3 and a restoration stage S4.

At the resetting stage S1, the input signal applied to STU is a low level, CLK1 inputs a high level, and CLK2 and CLK3 each input a low level. At this time, M3 is turned on, so as to enable the potential at QB to be VGH. M4 and M6 are turned on, so as to reset the potential at Q to be VGL1. In this way, before the start of the input stage, the potentials at the pull-up nodes of the shift-register units of a gate driving circuit are the same, i.e., a low level, so as to ensure the stability of the gate driving circuit.

At the input stage S2, the input signal is a high level, CLK2 inputs a high level, and CLK1 and CLK3 each input a low level. At this time, M1 is turned on, so as to write the input signal into the pull-up node Q, thereby to enable the potential at Q to be a high level. M7_1 and M7_2 are turned on, so as to enable CR and GN_OUT to output VGL1. M2 and M5 are turned on, so as to enable the potential at QB to be VGL1. VGL1 is smaller than VGL2, so M8_1 and M8_2 are turned off completely (because VGL1 is smaller than VGL2, a gate-to-source voltage of M8_1 is smaller than a threshold voltage of M8_1, and a gate-to-source voltage of M8_2 is smaller than a threshold voltage of M8_2, and M8_1 and M8_2 are both in the off state). In this way, it is able to reduce a leakage current flowing through each of M8_1 and M8_2, thereby to ensure the stable output from GN_OUT.

At the output stage S3, the input signal is a low level, CLK3 inputs a high level, and CLK1 and CLK2 each input a low level. At this time, the potential at the pull-up node Q is bootstrapped by C1, M7_1 and M7_2 are turned on, and M8_1 and M8_2 are turned off, so as to enable CR to output a high level, and enable GN_OUT to output a high level.

At the restoration stage S4, the input signal is a low level, CLK1 inputs a high level, and CLK2 and CLK3 each input a low level. At this time, M3 and M4 are turned on so as to enable the potential at QB to be a high level. M6 is turned on, so as to reset the potential at Q to VGL1. M7_1 and M7_2 are turned off, and M8_1 and M8_2 are turned on, so as to enable CR to output VGL2, and enable GN_OUT to output VGL2.

As shown in FIG. 3, a duty ratio of the first clock signal, a duty ratio of the second clock signal and a duty ratio of the third clock signal are each ⅓. A period of the first clock signal, a period of the second clock signal and a period of the third clock signal are each T. CLK2 is delayed by T/3 as compared with CLK1, and CLK3 is delayed by T/3 as compared with CLK2.

The present disclosure further provides in some embodiments a method for driving the above-mentioned shift register unit. Each display period includes an input stage, an output stage and a restoration stage arranged one after another. The method includes: at the input stage, applying an input signal to the input end, and writing, by the input sub-circuitry, the input signal into the pull-up node under the control of the second clock signal input end, so as to enable a potential at the pull-up node to be an active level; at the output stage, controlling, by the carry signal output sub-circuitry, the potential at the pull-up node to be still the active level; at the input stage and the output stage, writing, by the pull-down node control sub-circuitry, a first voltage into the pull-down node under the control of the pull-up node, outputting, by the gate driving output sub-circuitry, a third clock signal via the gate driving signal output end under the control of the pull-up node, and outputting, by the carry signal output sub-circuitry, the third clock signal via the carry signal output end under the control of the pull-up node; and at the restoration stage, writing, by the pull-up node control sub-circuitry, the first voltage into the pull-up node under the control of the first clock signal input end and the pull-down node, stopping, by the gate driving output sub-circuitry, outputting the third clock signal via the gate driving signal output end under the control of the pull-up node, stopping, by the carry signal output sub-circuitry, outputting the third clock signal via the carry signal output end under the control of the pull-up node, stopping, by the pull-down node control sub-circuitry, writing the first voltage into the pull-down node under the control of the pull-up node, writing, by the pull-down node control sub-circuitry, a second voltage into the pull-down node under the control of the first clock signal input end, outputting, by the gate driving output sub-circuitry, a third voltage via the gate driving signal output end under the control of the pull-down node, and outputting, by the carry signal output sub-circuitry, the third voltage via the carry signal output end under the control of the pull-down node.

According to the method in the embodiments of the present disclosure, a carry signal is provided by the carry signal output sub-circuitry, and the input signal is applied to a next-level shift register unit via the carry signal output end, so as to prevent the occurrence of insufficient driving capability caused when the input signal is applied by the gate driving signal output end to the next-level shift register unit, thereby to improve the output stability of a gate driving signal.

To be specific, the method further includes: at the input stage and the output stage, writing, by the pull-down node control sub-circuitry, the first clock signal into the pull-down node under the control of the pull-up node; and at the restoration stage, stopping, by the pull-down node control sub-circuitry, writing the first clock signal into the pull-down node under the control of the pull-up node.

In some possible embodiments of the present disclosure, each display period further includes a resetting stage prior to the input stage, and the method further includes, at the resetting stage, writing, by the pull-down node control sub-circuitry, a second voltage into the pull-down node under the control of the first clock signal input end, and writing, by the pull-up node control sub-circuitry, the first voltage into the pull-up node under the control of the first clock signal input end and the pull-down node.

During the implementation, the resetting stage is provided prior to the input stage. The potential at the pull-up node is reset at the resetting stage, so as to ensure the stability of the gate driving circuit.

To be specific, the gate driving output sub-circuitry includes a first gate driving output transistor and a second gate driving output transistor, and the carry signal output sub-circuitry includes a first carry signal output transistor, a second carry signal output transistor and a storage capacitor. When the second gate driving output transistor and the second carry signal output transistor are both N-type transistors, the first voltage inputted by the first voltage input end is substantially smaller than the third voltage inputted by the third voltage input end, so as to enable the second gate driving output transistor and the second carry signal output transistor to be each in an off state at the output stage, thereby to reduce a noise of the gate driving signal; or when the second gate driving output transistor and the second carry signal output transistor are both P-type transistors, the first voltage inputted by the first voltage input end is substantially greater than the third voltage inputted by the third voltage input end, so as to enable the second gate driving output transistor and the second carry signal output transistor to be each in the off state at the output stage, thereby to reduce the noise of the gate driving signal.

The present disclosure further provides a gate driving circuit, including a plurality of the above-mentioned shift register units coupled to each other in a cascaded manner. Apart from a last-level shift register unit, a carry signal output end of a current-level shift register unit is coupled to an input end of a next-level shift register unit.

Figure 4:
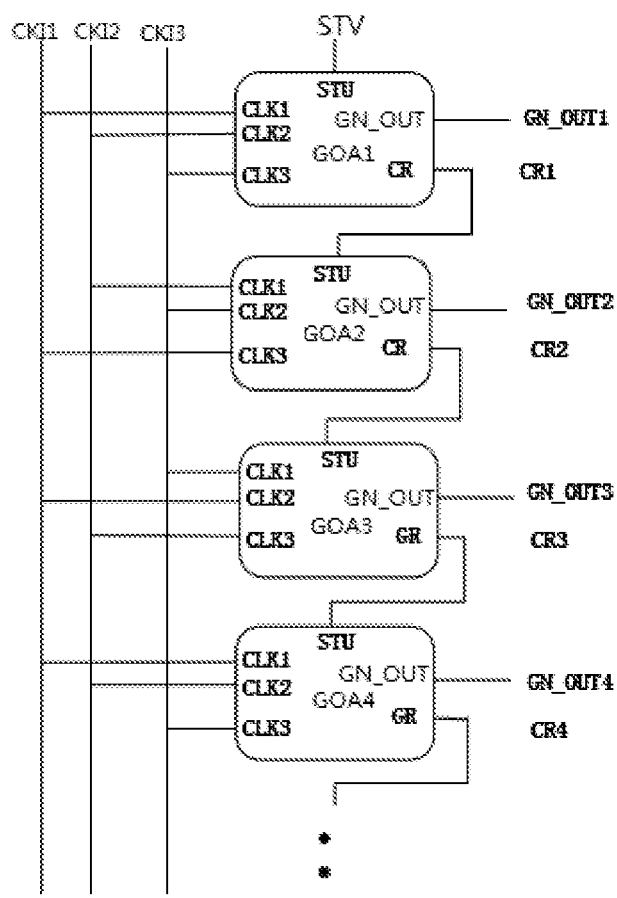
FIG. 4 is a schematic view showing a situation where previous four levels of shift register units of a gate driving circuit are coupled to each other in a cascaded manner according to some embodiments of the present disclosure.

FIG. 4 shows a situation where previous four shift register units of the gate driving circuit are coupled to each other in a cascaded manner.

In FIG. 4, GOA1 represents a first-level shift register unit of the gate driving circuit, GOA2 represents a second-level shift register unit of the gate driving circuit, GOA3 represents a third-level shift register unit of the gate driving circuit, and GOA4 represents a fourth-level shift register unit of the gate driving circuit.

In FIG. 4, STV represents a start signal, GN_OUT1 represents a first-level gate driving signal output end, CR1 represents a first-level carry signal output end, GN_OUT2 represents a second-level gate driving signal output end, CR2 represents a second-level carry signal output end, GN_OUT3 represents a third-level gate driving signal output end, CR3 represents a third-level carry signal output end, GN_OUT4 represents a fourth-level gate driving signal output end, and CR4 represents a fourth-level carry signal output end.

In FIG. 4, STU represents the input end, CLK1 represents the first clock signal input end, CLK2 represents the second clock signal input end, CLK3 represents the third clock signal input end, GN_OUT represents the gate driving signal output end, and CR represents the carry signal output end.

As shown in FIG. 4, CR1 is coupled to an input end of GOA2, CR2 is coupled to an input end of GOA3, and CR3 is coupled to an input end of GOA4.

In FIG. 4, CKI1 represents a first clock signal line, CKI2 represents a second clock signal line, CKI3 represents a third clock signal line, a first clock signal input end of GOA1 is coupled to CKI1, a second clock signal input end of GOA1 is coupled to CKI2, a third clock signal input end of GOA1 is coupled to CKI3, a first clock signal input end of GOA2 is coupled to CKI2, a second clock signal input end of GOA2 is coupled to CKI3, a third clock signal input end of GOA2 is coupled to CKI1, a first clock signal input end of GOA3 is coupled to CKI3, a second clock signal input end of GOA3 is coupled to CKI1, a third clock signal input end of GOA3 is coupled to CKI2, a first clock signal input end of GOA4 is coupled to CKI1, a second clock signal input end of GOA4 is coupled to CKI2, a third clock signal input end of GOA4 is coupled to CKI3, and so on.

Simulation of the gate driving circuit in the embodiments of the present disclosure shows that GN_OUT almost outputs the signal in a full-swing manner, so it is able to achieve the rail-to-rail output.

The present disclosure further provides in some embodiments a display device including the above-mentioned gate driving circuit.

The display device is any product or member having a display function, e.g., electronic paper, organic light-emitting diode (OLED) display device, mobile phone, flat-panel computer, television, display, laptop computer, digital photo frame or navigator.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A shift register unit, comprising an input sub-circuitry, a pull-up node control sub-circuitry, a pull-down node control sub-circuitry, a gate driving output sub-circuitry, and a carry signal output sub-circuitry,
wherein the input sub-circuitry is coupled to an input end, a second clock signal input end and a pull-up node, and configured to write an input signal from the input end into the pull-up node at an input stage under the control of the second clock signal input end;
the pull-up node control sub-circuitry is coupled to the pull-up node, a pull-down node, a first clock signal input end and a first voltage input end, and configured to write a first voltage into the pull-up node at a restoration stage under the control of the first clock signal input end and the pull-down node;
the first voltage input end is configured to input the first voltage;
the pull-down node control sub-circuitry is coupled to the pull-down node, the pull-up node, the first clock signal input end, the first voltage input end and a second voltage input end, and configured to write the first voltage into the pull-down node at the input stage and an output stage under the control of the pull-up node, and write a second voltage into the pull-down node at the restoration stage under the control of the first clock signal input end;
the second voltage input end is configured to input the second voltage;
the gate driving output sub-circuitry is coupled to the pull-up node, the pull-down node, a gate driving signal output end, a third clock signal input end and a third voltage input end, and configured to output a third clock signal via the gate driving signal output end at the input stage and the output stage under the control of the pull-up node, and output a third voltage via the gate driving signal output end at the restoration stage under the control of the pull-down node;
the third clock signal input end is configured to input the third clock signal, and the third voltage input end is configured to input the third voltage; and
the carry signal output sub-circuitry is coupled to the pull-up node, the pull-down node, a carry signal output end, the third clock signal input end and the third voltage input end, and configured to control a potential at the pull-up node, output the third clock signal via the carry signal output end at the input stage and the output stage under the control of the pull-up node, and output the third voltage via the carry signal output end at the restoration stage under the control of the pull-down node.

2. The shift register unit according to claim 1, wherein the pull-down node control sub-circuitry comprises:
a first pull-down node control transistor, a gate electrode of which is coupled to the pull-up node, a first electrode of which is coupled to the pull-down node, and a second electrode of which is coupled to the first voltage input end; and
a second pull-down node control transistor, a gate electrode of which is coupled to the first clock signal input end, a first electrode of which is coupled to the second voltage input end, and a second electrode of which is coupled to the pull-down node.

3. The shift register unit according to claim 1, wherein the pull-down node control sub-circuitry further comprises a third pull-down node control transistor, a gate electrode of which is coupled to the pull-up node, a first electrode of which is coupled to the down node, and a second electrode of which is coupled to the first clock signal input end.

4. The shift register unit according to claim 1, wherein the pull-up node control sub-circuitry comprises:
a first pull-up node control transistor, a gate electrode of which is coupled to the first clock signal input end, and a first electrode of which is coupled to the pull-up node; and
a second pull-up node control transistor, a gate electrode of which is coupled to the pull-down node, a first electrode of which is coupled to a second electrode of the first pull-up node control transistor, and a second electrode of which is coupled to the first voltage input end.

5. The shift register unit according to claim 1, wherein the gate driving output sub-circuitry comprises:
a first gate driving output transistor, a gate electrode of which is coupled to the pull-up node, a first electrode of which is coupled to the third clock signal input end, and a second electrode of which is coupled to the gate driving signal output end; and a second gate driving output transistor, a gate electrode of which is coupled to the pull-down node, a first electrode of which is coupled to the gate driving signal output end, and a second electrode of which is coupled to the third voltage input end, wherein the carry signal output sub-circuitry comprises:

a first carry signal output transistor, a gate electrode of which is coupled to the pull-up node, a first electrode of which is coupled to the third clock signal input end, and a second electrode of which is coupled to the carry signal output end;

a second carry signal output transistor, a gate electrode of which is coupled to the pull-down node, a first electrode of which is coupled to the carry signal output end, and a second electrode of which is coupled to the third voltage input end; and a storage capacitor, a first end of which is coupled to the pull-up node, and a second end of Which is coupled to the carry signal output end.

6. The shift register unit according to claim 5, wherein the second gate driving output transistor and the second carry signal output transistor are both N-type transistors, and the first voltage inputted by the first voltage input end is substantially smaller than the third voltage inputted by the third voltage input end.

7. The shift register unit according to claim 5, wherein the second end of the storage capacitor is merely coupled to the carry signal output end.

8. The shift register unit according to claim 5, wherein the second gate driving output transistor and the second carry signal output transistor are both P-type transistors, and the first voltage inputted by the first voltage input end is substantially greater than the third voltage inputted by the third voltage input end.

9. The shift register unit according to claim 5, wherein the second end of the storage capacitor is merely coupled to the gate driving signal output end.

10. The shift register unit according to claim 5, wherein the second end of the storage capacitor is coupled to both the gate driving signal output end and the carry signal output end.

11. The shift register unit according to claim 5, wherein the shift register unit adopts three clock signals and two low voltages.

12. The shift register unit according to claim 5, wherein the shift register unit comprises one capacitor and ten transistors, and adopts a two-stage output.

13. The shift register unit according to claim 1, wherein the input sub-circuitry comprises an input transistor, a gate electrode of which is coupled to the second clock signal input end, a first electrode of which is coupled to the pull-up node, and a second electrode of Which is coupled to the input end.

14. The shift register unit according to claim 1, wherein the first voltage is a first low voltage VGL1, the second voltage is a high voltage VGH, and the third voltage is a second low voltage VGL2.

15. A method for driving the shift register unit according to claim 1, wherein each display period comprises an input stage, an output stage and a restoration stage arranged one after another, wherein the method comprises:

at the input stage, applying an input signal to the input end, and writing, by the input sub-circuitry, the input signal into the pull-up node under the control of the second clock signal input end, to enable a potential at the pull-up node to be an active level;

at the output stage, controlling, by the carry signal output sub-circuitry, the potential at the pull-up node to be still the active level;

at the input stage and the output stage, writing, by the pull-down node control sub-circuitry, a first voltage into the pull-down node under the control of the pull-up node, outputting, by the gate driving output sub-circuitry, a third clock signal via the gate driving signal output end under the control of the pull-up node, and outputting, by the carry signal output sub-circuitry, the third clock signal via the carry signal output end under the control of the pull-up node; and at the restoration stage, writing, by the pull-up node control sub-circuitry, the first voltage into the pull-up node under the control of the first clock signal input end and the pull-down node, stopping, by the gate driving output sub-circuitry, outputting the third clock signal via the gate driving signal output end under the control of the pull-up node, stopping, by the carry signal output sub-circuitry, outputting the third clock signal via the carry signal output end under the control of the pull-up node, stopping, by the pull-down node control sub-circuitry, writing the first voltage into the pull-down node under the control of the pull-up node, writing, by the pull-down node control sub-circuitry, a second voltage into the pull-down node under the control of the first clock signal input end, outputting, by the gate driving output sub-circuitry, a third voltage via the gate driving signal output end under the control of the pull-down node, and outputting, by the carry signal output sub-circuitry, the third voltage via the carry signal output end under the control of the pull-down node.

16. The method according to claim 15, further comprising:

at the input stage and the output stage, writing, by the pull-down node control sub-circuitry, the first clock signal into the pull-down node under the control of the pull-up node; and at the restoration stage, stopping, by the pull-down node control sub-circuitry, writing the first clock signal into the pull-down node under the control of the pull-up node.

17. The method according to claim 15, wherein each display period further comprises a resetting stage prior to the input stage, and the method further comprises, at the resetting stage, writing, by the pull-down node control sub-circuitry, a second voltage into the pull-down node under the control of the first clock signal input end, and writing, by the pull-up node control sub-circuitry, the first voltage into the pull-up node under the control of the first clock signal input end and the pull-down node.

18. The method according to claim 15, wherein the gate driving output sub-circuitry comprises a first gate driving output transistor and a second gate driving output transistor, and the carry signal output sub-circuitry comprises a first carry signal output transistor, a second carry signal output transistor and a storage capacitor, wherein the second gate driving output transistor and the second carry signal output transistor are both N-type transistors, the first voltage inputted by the first voltage input end is substantially smaller than the third voltage inputted by the third voltage input end so that the second gate driving output transistor and the second carry signal output transistor are each in an off state at the output stage; or the second gate driving output transistor and the second carry signal output transistor are both P-type transistors, the first voltage inputted by the first voltage input end is substantially greater than the third voltage inputted by the third voltage input end so that the second gate driving output transistor and the second carry signal output transistor are each in the off state at the output stage.

19. A gate driving circuit, comprising a plurality of shift register units according to claim 1 connected to each other in a cascaded manner, wherein apart from a last-level shift register unit, a carry signal output end of a current-level shift register unit is coupled to an input end of a next-level shift register unit.

20. A display device, comprising the gate driving circuit according to claim 19.

* * * * *